(12) United States Patent
Haberecht (10) Patent No.: US 10,865,499 B2
(45) Date of Patent: Dec. 15, 2020

(54) SUSCEPTOR FOR HOLDING A SEMICONDUCTOR WAFER, METHOD FOR DEPOSITING AN EPITAXIAL LAYER ON A FRONT SIDE OF A SEMICONDUCTOR WAFER, AND SEMICONDUCTOR WAFER WITH EPITAXIAL LAYER

(71) Applicant: SILTRONIC AG, Munich (DE)

(72) Inventor: Joerg Haberecht, Freiberg (DE)

(73) Assignee: SILTRONIC AG, Munich (DE)

( * ) Notice: Subject to any disclaimer, the term of this patent is extended or adjusted under 35 U.S.C. 154(b) by 116 days.

(21) Appl. No.: 16/099,363

(22) PCT Filed: May 31, 2017

(86) PCT No.: PCT/EP2017/063089
§ 371 (c)(1),
(2) Date: Nov. 6, 2018

(87) PCT Pub. No.: WO2017/211630
PCT Pub. Date: Dec. 14, 2017

(65) Prior Publication Data
US 2019/0106809 A1    Apr. 11, 2019

(30) Foreign Application Priority Data
Jun. 9, 2016   (DE) .......... 10 2016 210 203

(51) Int. Cl.
*C30B 25/12*    (2006.01)
*C23C 16/458*   (2006.01)
(Continued)

(52) U.S. Cl.
CPC .......... *C30B 25/12* (2013.01); *C23C 16/4585* (2013.01); *C30B 29/06* (2013.01); *H01L 21/02433* (2013.01); *H01L 21/68735* (2013.01)

(58) Field of Classification Search
CPC . H01L 21/02296; H01L 21/20; H01L 21/203; H01L 21/2033; H01L 21/2036;
(Continued)

(56) References Cited

U.S. PATENT DOCUMENTS 6,129,047 A * 10/2000 Nakamura .......... C23C 16/4412
118/500
6,444,027 B1   9/2002 Yang et al.
(Continued)

FOREIGN PATENT DOCUMENTS

EP    1 460 679 A1    9/2004
JP    2004063779 A    2/2004
(Continued)

*Primary Examiner* — David C Spalla
(74) *Attorney, Agent, or Firm* — Brooks Kushman P.C.

(57) ABSTRACT

A susceptor for holding a semiconductor wafer during the deposition of an epitaxial layer on a front side of the semiconductor wafer, has a susceptor ring and a susceptor base, and recesses below the susceptor ring in the susceptor base which are arranged in a manner distributed rotationally symmetrically. The radial width of the recesses is greater than the radial width of the susceptor such that the susceptor ring does not completely cover the recesses.

12 Claims, 7 Drawing Sheets

(51) Int. Cl.
  *C30B 29/06* (2006.01)
  *H01L 21/02* (2006.01)
  *H01L 21/687* (2006.01)

(58) Field of Classification Search
  CPC .............. H01L 21/205; H01L 21/2053; H01L 21/2056; H01L 21/208; H01L 21/2085; H01L 21/68735; H01L 21/68785; C03B 25/12
  See application file for complete search history.

(56) References Cited

U.S. PATENT DOCUMENTS

| | | | |
|---|---|---|---|
| 2004/0144323 A1* | 7/2004 | Kai | C30B 25/14 |
| | | | 118/728 |
| 2007/0227441 A1 | 10/2007 | Narahara et al. | |
| 2008/0118712 A1 | 5/2008 | Schauer et al. | |
| 2009/0031954 A1 | 2/2009 | Nishikido et al. | |
| 2012/0309175 A1* | 12/2012 | Masumura | H01L 21/68735 |
| | | | 438/478 |
| 2013/0263776 A1 | 10/2013 | Pitney et al. | |
| 2013/0264690 A1 | 10/2013 | Masuda et al. | |
| 2015/0275395 A1* | 10/2015 | Kang | C30B 25/165 |
| | | | 118/728 |
| 2016/0010208 A1 | 1/2016 | Huang et al. | |
| 2016/0024652 A1 | 1/2016 | Ito et al. | |
| 2017/0287770 A1* | 10/2017 | Gangakhedkar | ............................ H01L 21/68785 |
| 2018/0363165 A1* | 12/2018 | Hager | H01L 21/02661 |

FOREIGN PATENT DOCUMENTS

| | | |
|---|---|---|
| JP | 2011-144091 | 7/2011 |
| TW | 201602404 A | 1/2016 |
| TW | 201614101 A | 4/2016 |

* cited by examiner

FIG. 1

*(PRIOR ART)*

FIG. 10

SUSCEPTOR FOR HOLDING A SEMICONDUCTOR WAFER, METHOD FOR DEPOSITING AN EPITAXIAL LAYER ON A FRONT SIDE OF A SEMICONDUCTOR WAFER, AND SEMICONDUCTOR WAFER WITH EPITAXIAL LAYER

CROSS REFERENCE TO RELATED APPLICATIONS

This application is the U.S. National Phase of PCT Appln. No. PCT/EP2017/063089 filed May 31, 2017, which claims priority to German Application No. 10 2016 210 203.6 filed Jun. 9, 2016, the disclosures of which are incorporated in their entirety by reference herein.

BACKGROUND OF THE INVENTION

1. Field of the Invention

The invention relates to a susceptor for holding a semiconductor wafer during the deposition of an epitaxial layer on a front side of the semiconductor wafer. The invention furthermore relates to a method for depositing an epitaxial layer on a front side of a semiconductor wafer, the susceptor being used in the course of said method, and to a semiconductor wafer with such an epitaxial layer.

2. Description of the Related Art

US 2008/0118712 A1 describes a susceptor, comprising a susceptor ring and a susceptor base. The susceptor ring has a ledge for placing a semiconductor wafer in the edge region of the rear side of the semiconductor wafer and is placed on the susceptor base for the purpose of depositing a layer on the front side of the semiconductor wafer.

US 2007/0227441 A1 draws attention to periodic fluctuations in the thickness of the epitaxial layer in the edge region of epitaxially coated semiconductor wafers composed of silicon. The reason for this is different growth rates at which the epitaxial layer grows. The different growth rates are related to the crystal orientation of the front side of the semiconductor wafer. The front side of the semiconductor wafer is that side surface of the semiconductor wafer on which the epitaxial layer is deposited. In order to make the thickness of the epitaxial layer more uniform in the edge region, US 2007/0227441 A1 proposes altering the structure of the susceptor with the period of the thickness fluctuations.

With the same objective, US 2013/0263776 proposes additionally arranging holes in the susceptor at locations which lie symmetrically on the circumference of the susceptor outside the radius of a semiconductor wafer placed on the susceptor.

SUMMARY OF THE INVENTION

It is an object of the present invention to improve the flatness of the edge region of semiconductor wafers with deposited epitaxial layers by modifying the susceptor, without having to affect the thickness of the epitaxial layer. In particular, the present invention provides a method that does not make the edge roll-off (ERO) more uniform as a result of the deposition of the epitaxial layer. These and other objects are achieved by means of a susceptor for holding a semiconductor wafer during the deposition of an epitaxial layer on a front side of the semiconductor wafer, comprising a susceptor ring having a ledge for placing the semiconductor wafer in the edge region of a rear side of the semiconductor wafer; and a susceptor base, wherein the susceptor ring lies around a center of the susceptor base on the susceptor base, characterized by recesses in the susceptor base which are present below the susceptor ring and which are arranged in a manner distributed rotationally symmetrically on the susceptor base and each have a radial width that is greater than a radial width of the susceptor ring.

DETAILED DESCRIPTION OF THE PREFERRED EMBODIMENTS

The invention furthermore relates to a method for depositing an epitaxial layer on a front side of a semiconductor wafer, comprising providing the semiconductor wafer;

arranging the semiconductor wafer on the ledge of a susceptor ring of a susceptor according to the invention, wherein the susceptor base has a number of recesses corresponding to a number of first of two alternating partial regions of the edge region of the front side of the semiconductor wafer, and a growth rate of the epitaxial layer is lower in the first partial regions than in the second partial regions owing to a crystal orientation of the front side, in such a way that the first partial regions lie above the recesses in the susceptor base; and depositing the epitaxial layer on the front side of the semiconductor wafer.

The invention also relates to a semiconductor wafer with an epitaxial layer, wherein the thickness of the epitaxial layer in first partial regions of the edge region of the semiconductor wafer with the epitaxial layer is thinner than in second partial regions of the edge region, and material depositions are present on the rear side of the semiconductor wafer, by means of which the total thickness of the semiconductor wafer with the epitaxial layer in the first partial regions is matched to the total thickness of the semiconductor wafer with the epitaxial layer in the second partial regions.

The semiconductor wafer preferably has a local flatness in the edge region having a maximum ESFQR value of not more than 12 nm for an edge exclusion of 2 mm, preferably of not more than 10 nm for an edge exclusion of 2 mm.

The semiconductor wafer or at least one part thereof comprising the surface of the semiconductor wafer is monocrystalline and preferably consists of silicon, germanium or a mixture of these elements. The semiconductor wafer may consist completely of one of the materials mentioned. However, this may also be an SOI wafer (silicon on insulator), a bonded semiconductor wafer or a substrate wafer which has already been coated with one or more epitaxial layers. The epitaxial layer preferably consists of silicon, germanium or a mixture of these elements, and contains dopant if appropriate.

The semiconductor wafer may be sliced from a single crystal that was crystallized according to the FZ method (float zone) or according to the CZ method. The CZ method comprises immersing a seed crystal in a melt contained in a crucible, and raising the seed crystal and the single crystal crystallizing thereon from the melt.

The semiconductor wafer has a diameter of at least 200 mm, preferably at least 300 mm. The front side of the semiconductor wafer is preferably <100>-oriented or <110>-oriented.

In the case of the <100> orientation of the front side, the edge region of the front side of the semiconductor wafer may be subdivided into respectively four alternating first and second partial regions. In the four first partial regions, the growth rate of an epitaxial layer is lower than in the four second partial regions of the edge region. The centers of the first partial regions each have an angle position θ with respect to the circumference of the semiconductor wafer. If an orientation notch identifies a <110> direction perpendicular to the <100> orientation of the front side of the semiconductor wafer and if the angle position θ of 270° is assigned to said direction, the centers of the four first partial regions have an angle position θ of 45°, 135°, 225° and 315°, respectively, corresponding to the angle positions of the <100> directions perpendicular to the <100> orientation of the front side of the semiconductor wafer.

In the case of the <110> orientation of the front side, the edge region of the front side of the semiconductor wafer may be subdivided into respectively two alternating partial regions. In the two first partial regions, the growth rate of an epitaxial layer on the front side of the semiconductor wafer is lower than in the two second partial regions of the edge region. If the orientation notch identifies a <110> direction perpendicular to the <110> orientation of the front side of the semiconductor wafer and if the angle position θ of 270° is assigned to said direction, the centers of the two first partial regions have an angle position θ of 0° and 180°, respectively, corresponding to the angle positions of the <100> directions perpendicular to the <110> orientation of the front side of the semiconductor wafer.

During the deposition of an epitaxial layer on the front side of the semiconductor wafer, the semiconductor wafer lies on the ledge of the susceptor ring, and the susceptor ring lies on the upper placement area of the susceptor base. The semiconductor wafer is arranged such that the first partial regions of the edge region of the front side of the semiconductor wafer, in which first partial regions the growth rate is lower owing to the crystal orientation of the front side, lie above the recesses in the susceptor base.

One feature of the invention comprises placing the susceptor ring on the upper placement area of the susceptor base and subsequently placing the semiconductor wafer on the ledge of the susceptor ring such that the semiconductor wafer is arranged in the required manner. An alternative feature of the invention comprises placing the semiconductor wafer on the ledge of the susceptor ring and subsequently placing the susceptor ring with the semiconductor wafer lying on the ledge on the upper placement area of the susceptor base such that the semiconductor wafer is arranged in the required manner.

The susceptor base preferably consists of graphite felt or of graphite felt coated with silicon carbide, or of graphite coated with silicon carbide, or of silicon carbide, and the susceptor ring preferably consists of silicon carbide or of some other material coated with silicon carbide. The other material is preferably graphite or silicon. The susceptor ring has an internal diameter and an external diameter. The internal diameter is smaller and the external diameter is larger than the diameter of the semiconductor wafer on whose front side an epitaxial layer is intended to be deposited. The radial width of the susceptor ring corresponds to half of the difference between external diameter and internal diameter of the susceptor ring. The ledge of the susceptor ring extends from the inner edge of the susceptor ring as far as a step which increases the height of the susceptor ring. The ledge is preferably shaped in a manner falling inward from the step.

The recesses in the susceptor base are arranged in a manner distributed rotationally symmetrically. They each have a radial width and are preferably milled into the susceptor base.

The radial width of the recess is in each case greater than the radial width of the susceptor ring, preferably by not less than 10 mm and not more than 100 mm. For this reason, the susceptor ring does not completely cover the recesses. Owing to the recesses, during the deposition of the epitaxial layer on the front side of the semiconductor wafer, material is additionally also deposited on the rear side of the semiconductor wafer. According to the invention, care is taken to ensure that the location of the additional deposition substantially lies below the first partial regions of the edge region of the front side of the semiconductor wafer. Although an epitaxial layer is deposited on the front side of the semiconductor wafer, which epitaxial layer is beset by the deficiency that the thickness of the epitaxial layer in the first partial regions of the edge region is thinner than the second partial regions; nevertheless, the semiconductor wafer with deposited epitaxial layer has a particularly uniform total thickness in the edge region because the deficiency loses importance owing to the targeted deposition of additional material on the rear side of the semiconductor wafer.

The radial position of the additional deposition of material in the edge region of the rear side of the semiconductor wafer can be influenced in a targeted manner. It depends on the selection of length over which the ledge is covered by the semiconductor wafer. The greater the length, the further inward is the position of the material deposition. The length of the covering is preferably not less than 0.5 mm and not more than 3 mm.

The recesses in the susceptor base each have a width in the circumferential direction whose magnitude can be specified by a center angle. The two radii from the center of the susceptor base to the two ends of a recess form the center angle of the recess. The center of a recess lies on the angle bisector of the center angle.

If the intention is to deposit an epitaxial layer on a front side of the semiconductor wafer which has a <100> orientation, the center angle of the four recesses in the susceptor base is in each case preferably 60° to 70°, more preferably 65°. The semiconductor wafer is preferably arranged on the ledge of the susceptor ring in such a way that the centers of the four first partial regions of the edge region of the front side of the semiconductor wafer lie above the centers of the four recesses.

If the intention is to deposit an epitaxial layer on a front side of the semiconductor wafer which has a <110> orientation, the center angle of the two recesses in the susceptor base is in each case preferably 90° to 110°, more preferably 100°. The semiconductor wafer is preferably arranged on the ledge of the susceptor ring in such a way that the centers of the two first partial regions of the edge region of the front side of the semiconductor wafer lie above the centers of the two recesses.

The recesses in the susceptor base preferably have a depth of preferably not less than 0.3 mm and not more than 1.0 mm. The depth of a recess may be uniform. It is preferred, however, for the depth to increase and decrease again in the circumferential direction and for the cross section of the recesses in said direction to have a contour that is U- or V-shaped.

The features specified with regard to the abovementioned embodiments of the method according to the invention can be correspondingly applied to the device according to the invention. Conversely, the features specified with regard to the abovementioned embodiments of the device according to the invention can correspondingly be applied to the method according to the invention. These and other features of the embodiments according to the invention are explained in the description of the figures and in the claims. The individual features can be realized either separately or in combination as embodiments of the invention. Furthermore, they can describe advantageous embodiments which are independently protectable.

The invention is explained in greater detail below with reference to drawings.

Figure 1:
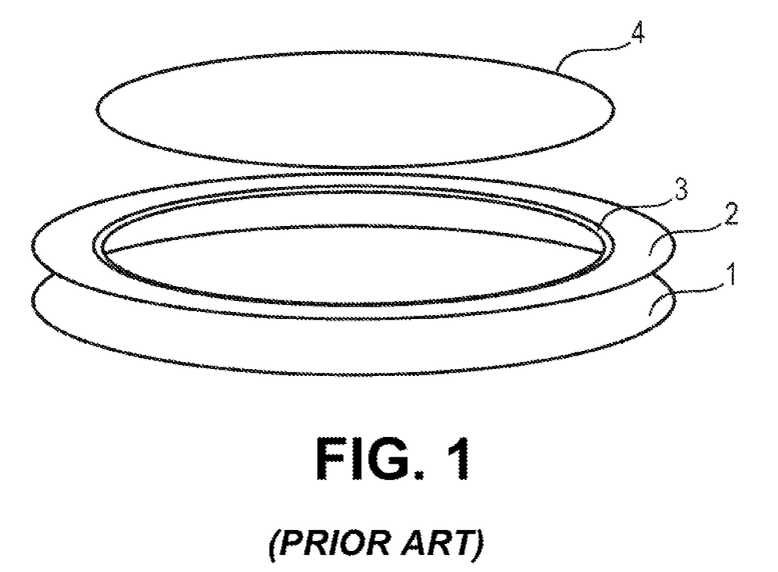
FIG. 1 is a depiction which represents the prior art and which shows the relative arrangement of a susceptor base, a susceptor ring and a semiconductor wafer.

FIG. 1 is a depiction which represents the prior art and which shows the relative arrangement of a susceptor base, a susceptor ring and a semiconductor wafer.

Figure 2:
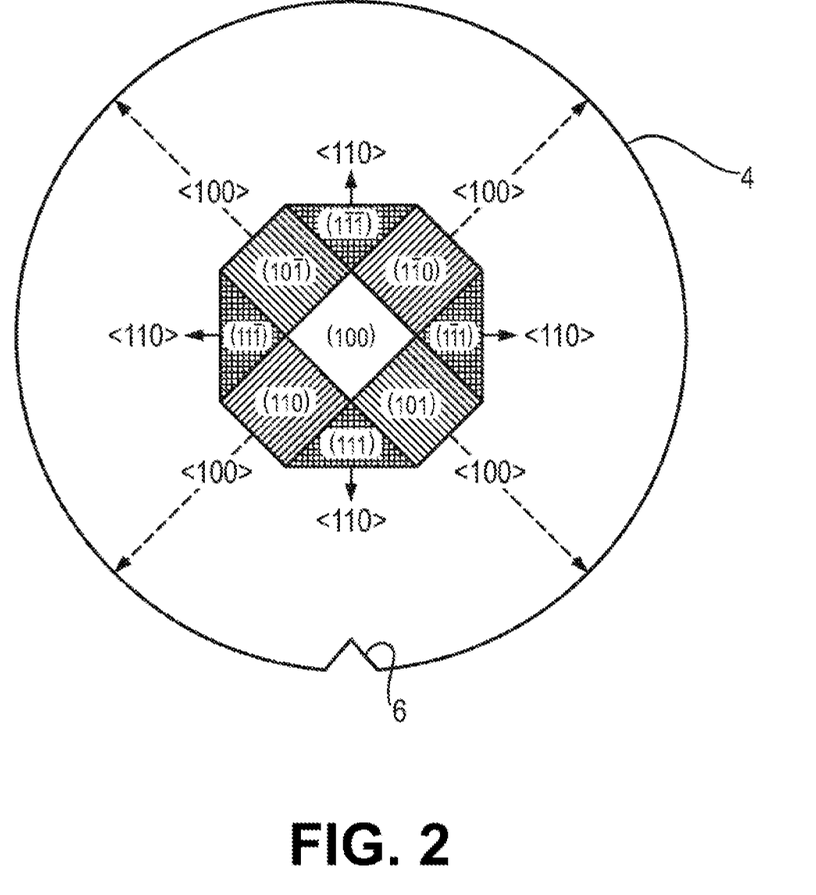
FIG. 2 and FIG. 3 show orientation features of semiconductor wafers having (100) face orientation of the front side (FIG. 2) and having (110) face orientation of the front side (FIG. 3).
Figure 3:
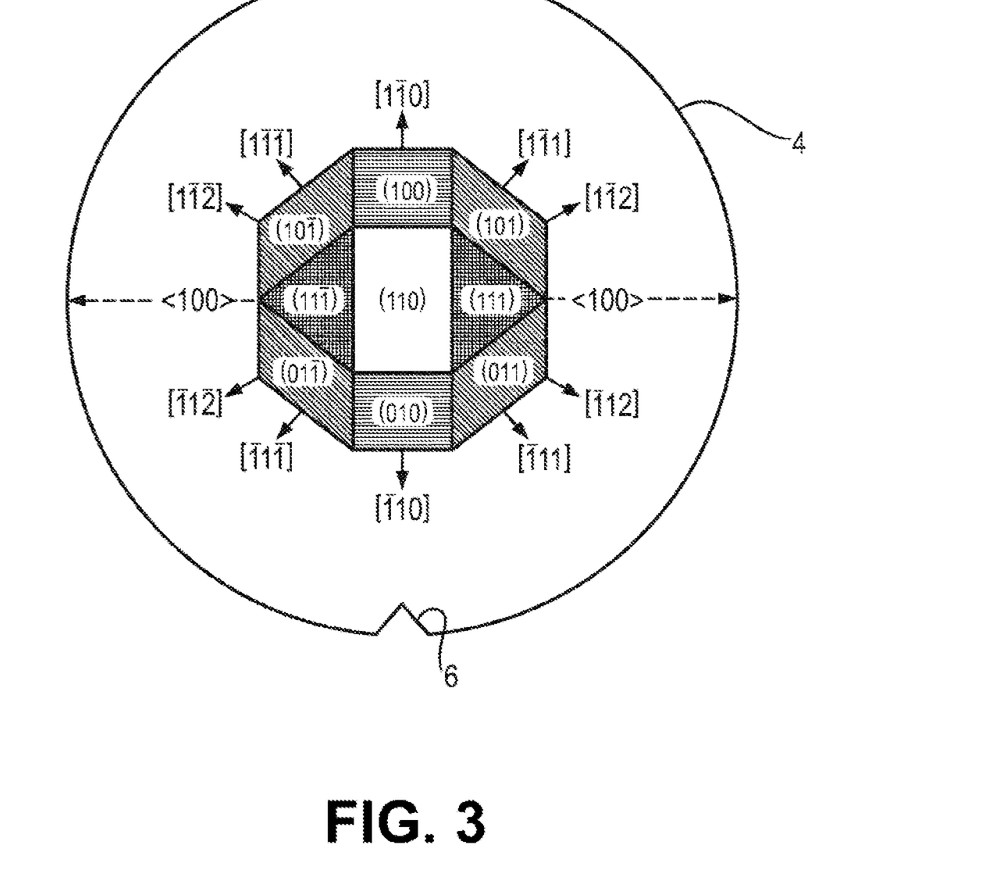

FIG. 2 and FIG. 3 show orientation features of semiconductor wafers having (100) face orientation of the front side (FIG. 2) and having (110) face orientation of the front side (FIG. 3).

Figure 4:
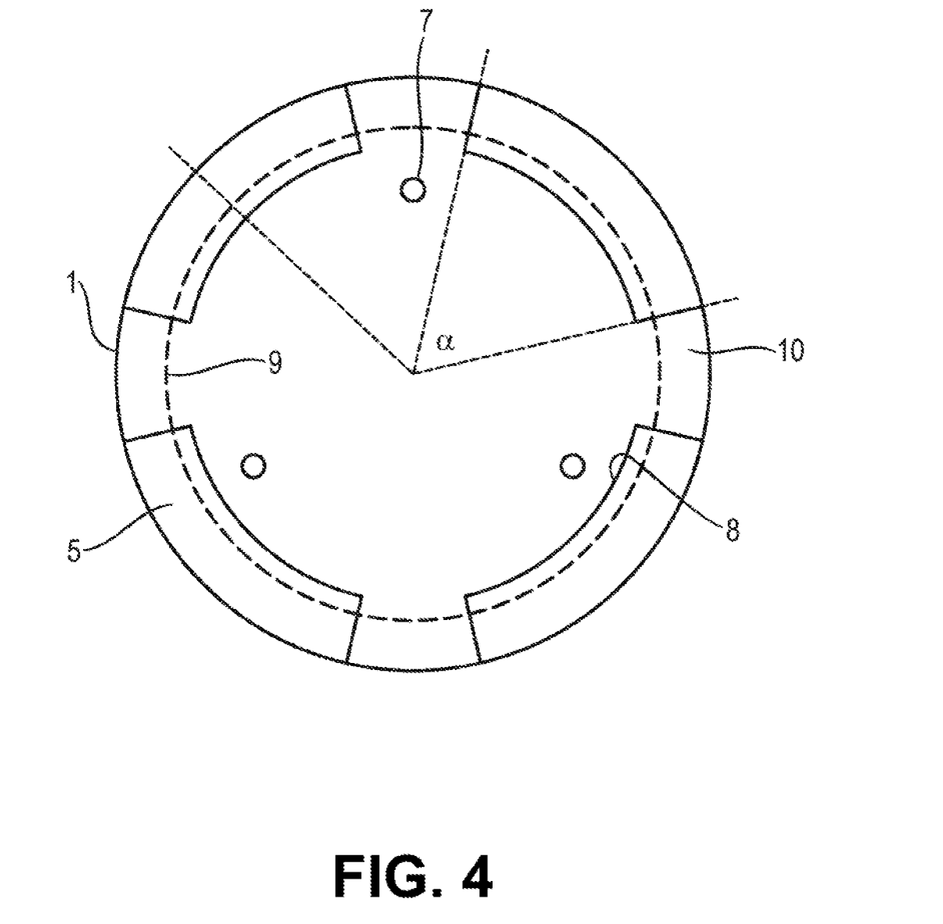
FIG. 4 shows a susceptor base according to the invention in plan view.

FIG. 4 shows a susceptor base according to the invention in plan view.

Figure 5:
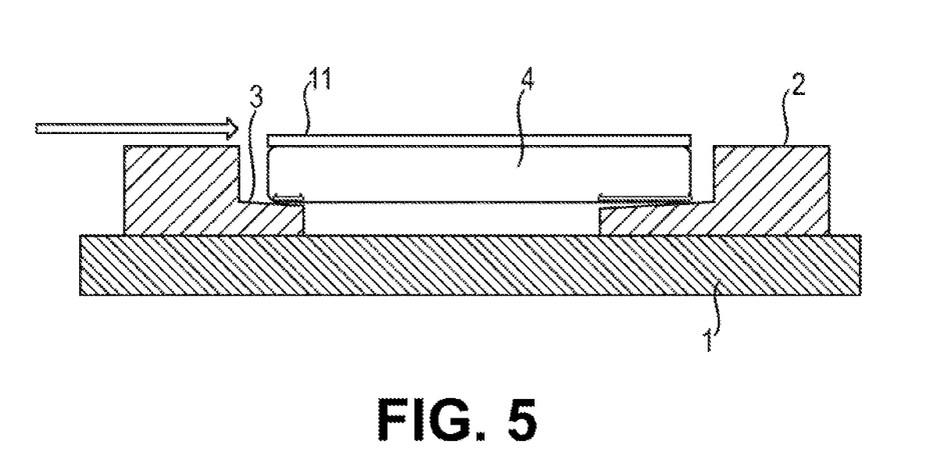
FIG. 5 and FIG. 6 show radial vertical sections through the susceptor base at different locations, FIG. 5 vertical sections in the region between two recesses in the susceptor base and FIG. 6 vertical sections in the region of one recess in the susceptor base (FIG. 6).
Figure 6:
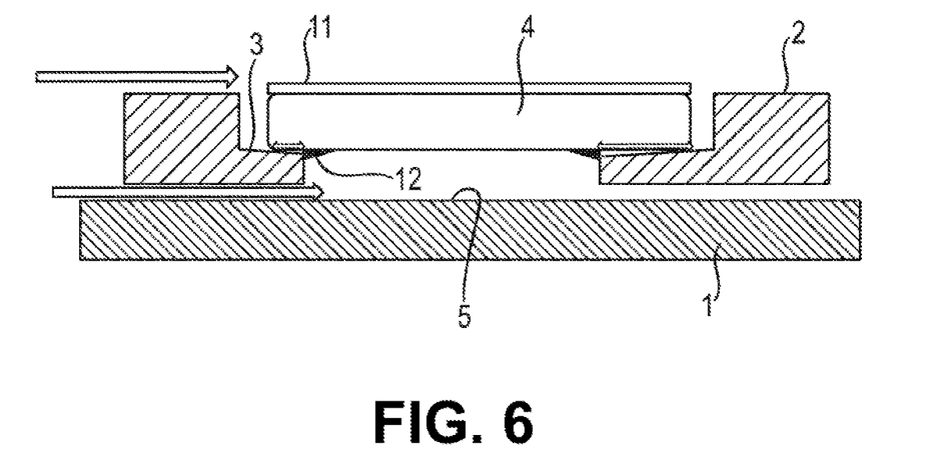

FIG. 5 and FIG. 6 show radial vertical sections through the susceptor base at different locations, FIG. 5 vertical sections in the region between two recesses in the susceptor base and FIG. 6 vertical sections in the region of one recess in the susceptor base (FIG. 6).

Figure 7:
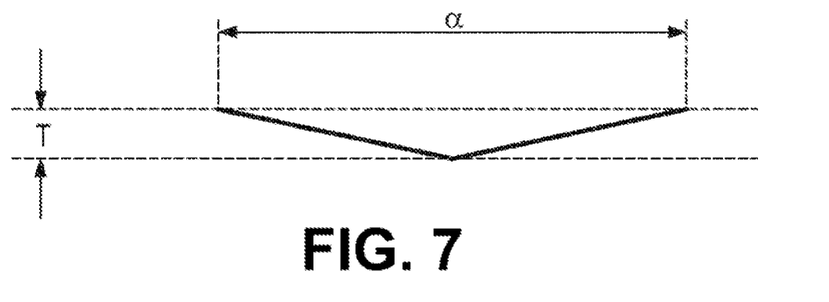
FIG. 7, FIG. 8 and FIG. 9 show preferred forms of the contour of a cross section in the circumferential direction through a recess in accordance with FIG. 4.
Figure 8:
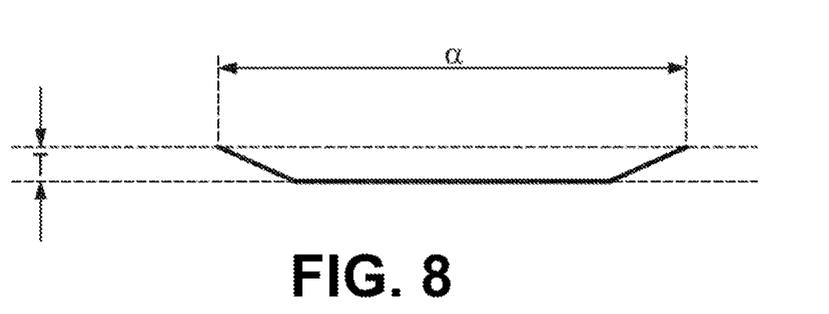
Figure 9:
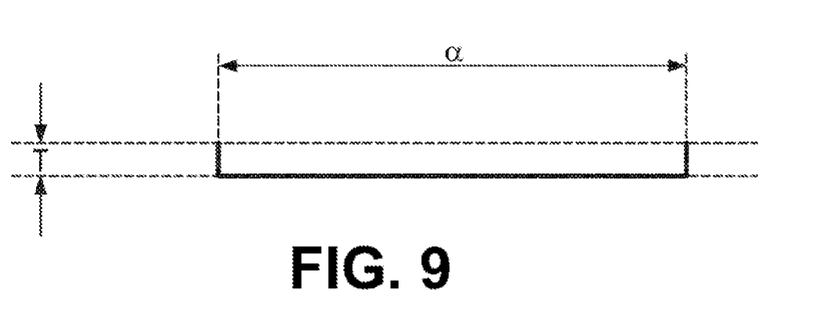

FIG. 7, FIG. 8 and FIG. 9 show preferred forms of the contour of a cross section in the circumferential direction through a recess in accordance with FIG. 4.

Figure 10:
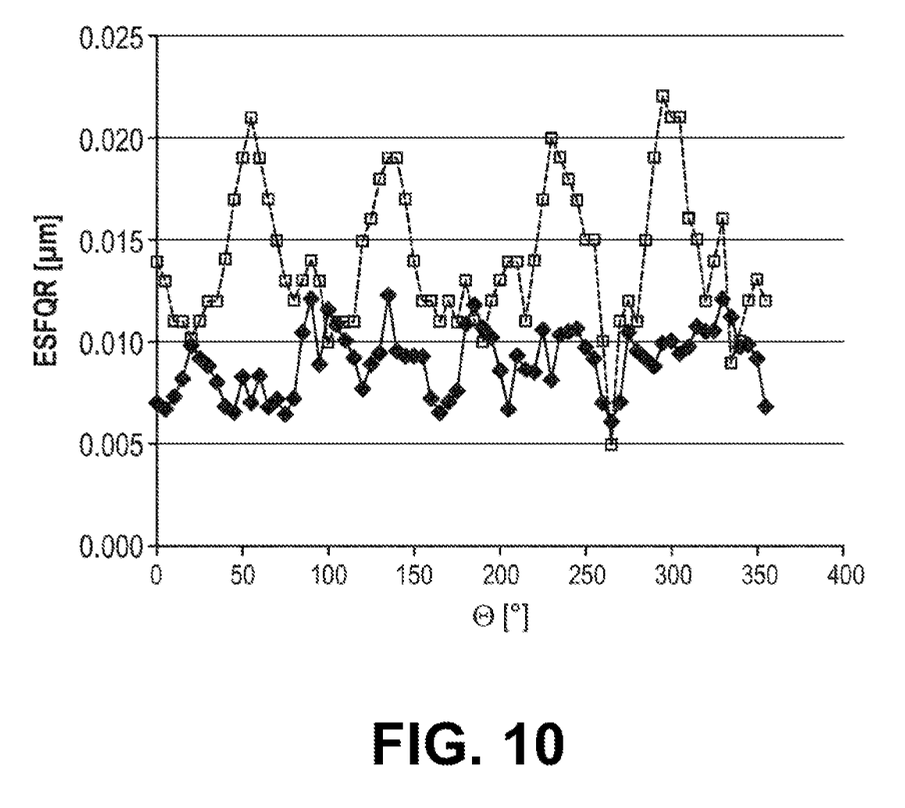
FIG. 10 is a diagram showing the flatness of epitaxially coated test wafers in the edge region. In the diagram, the ESFQR values are plotted against the angle position θ.

FIG. 10 is a diagram showing the flatness of epitaxially coated test wafers in the edge region. In the diagram, the ESFQR values are plotted against the angle position θ.

LIST OF REFERENCE SIGNS USED

1 Susceptor base
2 Susceptor ring
3 Ledge
4 Semiconductor wafer
5 Recess
6 Orientation notch
7 Lifting pin hole
8 Inner edge of the recess
9 Inner edge of the susceptor ring
10 Upper placement area
11 Epitaxial layer
12 Material deposition
α Center angle The arrangement in accordance with FIG. 1 comprises a susceptor base 1 and a susceptor ring 2 having an inner edge 9 with a ledge 3 adjacent thereto toward the outside. A semiconductor wafer 4 can be placed on the ledge 3 in the edge region of the rear side of the semiconductor wafer.

In the susceptor base 1 in accordance with FIG. 4, there are present four recesses 5, which are arranged in a manner distributed rotationally symmetrically on the upper placement area 10 of the susceptor base 1, and also lifting pin holes 7 for raising and lowering the semiconductor wafer. The recesses 5 each have an inner edge 8 and a width in the circumferential direction corresponding to the magnitude of the center angle α. The center of a recess lies on the angle bisector (dotted line) of the center angle. The number of recesses corresponds to the number of four partial regions of the edge region of the front side of a semiconductor wafer, in which partial regions the growth rate of the epitaxial layer is lower than in the partial regions between the four partial regions owing to the crystal orientation of the front side.

FIG. 2 shows orientation features of such a semiconductor wafer 4 having <100> orientation of the front side. The orientation notch 6 marks an angle position θ of 270°. Accordingly, the centers of the four partial regions of the edge region with a lower growth rate of the epitaxial layer are situated at the angle positions 45°, 135°, 225° and 315° to which the tips of the dashed arrows point.

FIG. 3 shows orientation features of a semiconductor wafer 4 having <110> orientation of the front side. The orientation notch 6 marks an angle position θ of 270°. Accordingly, the centers of the two partial regions of the edge region with a lower growth rate of the epitaxial layer are situated at the angle positions 0° and 180° to which the tips of the dashed arrows point.

In order to deposit an epitaxial layer 11 on a front side of the semiconductor wafer, the semiconductor wafer 4 having <100> orientation of the front side is arranged on the ledge 3 of the susceptor ring 2 in such a way that the four first partial regions lie above the four recesses 5 in the susceptor base 1, preferably such that the centers of the four first partial regions lie above the centers of the four recesses.

In order to deposit an epitaxial layer on a front side of the semiconductor wafer, the semiconductor wafer having <110> orientation of the front side is arranged on the ledge of the susceptor ring in such a way that the two first partial regions lie above the two recesses in the susceptor base, preferably such that the centers of the two first partial regions lie above the centers of the two recesses.

FIG. 6 shows a cross section in a radial direction through the center of one recess in the susceptor base, and FIG. 5 shows the corresponding cross section between two recesses.

Deposition gas passes on the path indicated by the shorter arrow to the front side of the semiconductor wafer 4, on which the epitaxial layer 11 is deposited. Owing to the recess 5, a further path is present for the deposition gas, said further path being indicated by the longer arrow in FIG. 6 and leading under the susceptor ring 2 through to the rear side of the semiconductor wafer 4, such that the material 12 is deposited in the edge region of the rear side of the semiconductor wafer 4. The double-headed arrows denote the length of the covering of the ledge 3 by the semiconductor wafer 4. The radial position of the material deposition 12 can be influenced by the choice of the length of the covering and migrates inward as the length of the covering increases. The shorter covering arises with the use of a susceptor ring 2 having a ledge 3 having a comparatively small radial width, and the larger covering arises through the use of a susceptor ring 2 whose ledge 3 is wider.

The material deposition 12 on the rear side of the semiconductor wafer 4 is absent where the susceptor ring 2 lies directly on the susceptor base because no recess is present (FIG. 5).

FIG. 7 shows the cross section in the circumferential direction through a recess in accordance with FIG. 4. The contour of the cross section is V-shaped because the depth T of the recess along the center angle α of preferably 65° rises up to a maximum of 0.3 mm to 1 mm and decreases again, preferably linearly rises and decreases.

FIG. 8 shows the cross section in the circumferential direction through a recess in accordance with FIG. 4 with a contour deviating from FIG. 7. The contour of the cross section is trapezoidal because the depth T of the recess along the center angle α of preferably 65° rises up to a maximum of 0.3 mm to 1 mm, preferably rises linearly, remains at the maximum over a portion and decreases again, preferably decreases linearly. This form of the contour is particularly preferred with regard to the way in which the object is achieved.

FIG. 9 shows the cross section in the circumferential direction through a recess in accordance with FIG. 4 with a contour deviating from FIG. 7 and FIG. 8. The contour of the cross section is U-shaped because the depth T of the recess along the center angle α of preferably 65° rises rapidly up to a maximum of 0.3 mm to 1 mm, remains at the maximum and decreases rapidly again, preferably abruptly rises and decreases.

DESCRIPTION OF EXEMPLARY EMBODIMENTS ACCORDING TO THE INVENTION

Semiconductor wafers composed of monocrystalline silicon having a diameter of 300 mm and a <100> orientation of the front side were coated with an epitaxial layer composed of silicon in a single-wafer reactor. One portion of the semiconductor wafers (comparative wafers) was coated in a manner lying on a susceptor in accordance with FIG. 1. The susceptor base lacked recesses according to the invention. Another portion of the semiconductor wafers was coated according to the invention, that is to say in a manner lying on a susceptor according to the invention. The centers of the four partial regions with a lower growth rate of the epitaxial layer lay above the centers of four recesses in the susceptor base.

Afterward, the local flatness of the coated semiconductor wafers in the edge region was determined. FIG. 10 shows ESFQR values (edge exclusion 2 mm, laser marking at θ=265°, sector length 30 mm) of respectively one of the coated semiconductor wafers of said one portion and of the other portion. In the case of the semiconductor wafer coated according to the invention, the ESFQR values (solid line) do not exhibit the characteristic periodic fluctuations, whereas they can be seen in the case of the comparative wafer (dotted line).

The above description of exemplary embodiments should be understood to be by way of example. The disclosure made thereby firstly enables the person skilled in the art to understand the present invention and the advantages associated therewith, and secondly also encompasses, within the understanding of the person skilled in the art, obvious alterations and modifications of the structures and methods described. Therefore, all such alterations and modifications and also equivalents are intended to be covered by the scope of protection of the claims.

The invention claimed is:

1. A susceptor for holding a semiconductor wafer during the deposition of an epitaxial layer on a front side of the semiconductor wafer, comprising
 a susceptor ring having a ledge for placing the semiconductor wafer in an edge region of a rear side of the semiconductor wafer; and
 a susceptor base, wherein the susceptor ring is positioned about a center of the susceptor base on the susceptor base, wherein
 the susceptor base contains recesses which are present below the susceptor ring and which are arranged in a manner distributed rotationally symmetrically on the susceptor base and each have a radial width that is greater than a radial width of the susceptor ring.

2. The susceptor of claim 1, wherein the recesses in the susceptor base have the shape of annulus segments.

3. The susceptor of claim 2, wherein the recesses have a center angle that is not less than 60° and not more than 70° or not less than 90° and not more than 110°.

4. The susceptor of claim 1, wherein a cross section of the recesses in a circumferential direction of the susceptor base has a contour that is V shaped.

5. The susceptor of claim 1, wherein a cross section of the recesses in a circumferential direction of the susceptor base has a contour that is U shaped.

6. The susceptor of claim 1, wherein a cross section of the recesses in the circumferential direction of the susceptor base has a contour that is trapezoidal.

7. A method for depositing an epitaxial layer on a front side of a semiconductor wafer, comprising
 providing the semiconductor wafer;
 arranging the semiconductor wafer on a ledge of a susceptor ring of a susceptor of claim 1, wherein the susceptor base has a number of recesses corresponding to a number of first of two alternating partial regions of the edge region of the front side of the semiconductor wafer, and a growth rate of the epitaxial layer is lower in the first partial regions than in the second partial regions owing to a crystal orientation of the front side, in such a way that the first partial regions lie above the recesses in the susceptor base; and
 depositing the epitaxial layer on the front side of the semiconductor wafer.

8. The method of claim 7, further comprising providing a semiconductor wafer having <100> orientation of the front side and arranging the semiconductor wafer above four recesses in the susceptor base.

9. The method of claim 7, further comprising providing a semiconductor wafer having <110> orientation of the front side and arranging the semiconductor wafer above two recesses in the susceptor base.

10. The method of claim 7, wherein the semiconductor wafer is arranged on the ledge in such a way that the ledge is covered by the semiconductor wafer over a length of not less than 0.5 mm and not more than 3 mm.

11. A semiconductor wafer with an epitaxial layer, wherein the thickness of the epitaxial layer in first partial regions of the edge region of the semiconductor wafer with epitaxial layer is thinner than in second partial regions of the edge region, and material depositions are present on the rear side of the semiconductor wafer, by means of which the total thickness of the semiconductor wafer with the epitaxial layer in the first partial regions is matched to the total thickness of the semiconductor wafer with the epitaxial layer in the second partial regions.

12. The semiconductor wafer of claim 11, which has a local flatness in the edge region having a maximum ESFQR value of not more than 12 nm for an edge exclusion of 2 mm.

* * * * *